(12) United States Patent
Shavit et al.

(10) Patent No.: US 11,557,459 B2
(45) Date of Patent: *Jan. 17, 2023

(54) SYSTEM AND METHOD FOR LEARNING-GUIDED ELECTRON MICROSCOPY

(71) Applicants: Massachusetts Institute of Technology, Cambridge, MA (US); President and Fellows of Harvard College, Cambridge, MA (US)

(72) Inventors: Nir Shavit, Cambridge, MA (US); Aravinathan Samuel, Cambridge, MA (US); Jeff Lichtman, Cambridge, MA (US); Lu Mi, Cambridge, MA (US)

(73) Assignees: Massachusetts Institute of Technology, Cambridge, MA (US); President and Fellows of Harvard College, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/469,314

(22) Filed: Sep. 8, 2021

(65) Prior Publication Data

US 2022/0068599 A1 Mar. 3, 2022

Related U.S. Application Data

(63) Continuation of application No. 16/835,132, filed on Mar. 30, 2020, now Pat. No. 11,164,721.
(Continued)

(51) Int. Cl.
*H01J 37/28* (2006.01)
*H01J 37/21* (2006.01)
(Continued)

(52) U.S. Cl.
CPC ............... *H01J 37/28* (2013.01); *G06T 7/11* (2017.01); *G06V 10/25* (2022.01); *H01J 37/21* (2013.01);
(Continued)

(58) Field of Classification Search
CPC .... H01J 37/28; H01J 37/21; H01J 2237/1536; G06T 7/11; G06T 2207/10061; G06T 2207/20084; G06K 9/3233
(Continued)

(56) References Cited

U.S. PATENT DOCUMENTS 5,175,495 A 12/1992 Brahme et al.
11,164,721 B2 * 11/2021 Shavit .................... G06K 9/627
(Continued)

FOREIGN PATENT DOCUMENTS

WO 2019025298 2/2019

OTHER PUBLICATIONS

International Search Report and Written Opinion for PCT/US20/25832, dated Jul. 9, 2020.

*Primary Examiner* — Nicole M Ippolito
(74) *Attorney, Agent, or Firm* — Peter A. Nieves; Nieves IP Law Group, LLC (57) ABSTRACT

A system and method is provided for rapidly collecting high quality images of a specimen through controlling a refocusable beam of an electron microscope. An intelligent acquisition system instructs the electron microscope to perform an initial low-resolution scan of a sample. A low-resolution image of the sample is received by the intelligent acquisition system as scanned image information from the electron microscope. The intelligent acquisition system then determines regions of interest within the low-resolution image and instructs the electron microscope to perform a high-resolution scan of the sample, only in areas of the
(Continued)

sample corresponding to the determined regions of interest or portions of the determined regions of interest, so that other regions within the sample are not scanned at high-resolution, where the high-resolution scanning in the regions of interest is guided by a probability map using a deep neural network for segmentation.

15 Claims, 7 Drawing Sheets

Related U.S. Application Data (60) Provisional application No. 62/825,722, filed on Mar. 28, 2019.

(51) Int. Cl.
*G06T 7/11* (2017.01)
*G06V 10/25* (2022.01)

(52) U.S. Cl.
CPC ............... *G06T 2207/10061* (2013.01); *G06T 2207/20084* (2013.01); *H01J 2237/1536* (2013.01)

(58) Field of Classification Search
USPC .......................... 250/306, 307, 309, 310, 311
See application file for complete search history.

(56) References Cited

U.S. PATENT DOCUMENTS

| | | |
|---|---|---|
| 2012/0243797 A1 | 9/2012 | Di Venuto Dayer |
| 2014/0226003 A1 | 8/2014 | Phaneuf et al. |
| 2015/0287578 A1 | 10/2015 | Bendall et al. |
| 2019/0043690 A1 | 2/2019 | MacLellan et al. |

* cited by examiner

SYSTEM AND METHOD FOR LEARNING-GUIDED ELECTRON MICROSCOPY

CROSS-REFERENCE TO RELATED APPLICATIONS

This application is a continuation of U.S. application Ser. No. 16/835,132, entitled "System and Method for Learning-Guided Electron Microscopy", filed on Mar. 30, 2020, which claims the benefit of U.S. Provisional Application No. 62/825,722, filed on Mar. 28, 2019. The entire teaching of the above applications is incorporated herein by reference.

FIELD OF THE INVENTION

The present invention relates to microscopy, and more particularly, is related to optimizing microscopy data acquisition, while taking into account heterogeneity.

BACKGROUND OF THE INVENTION

Electron microscopy has a plethora of applications, from material science, to semiconductor analysis, to biological analysis, and much more. Unfortunately, there has been a limitation in productivity and efficiency to its application. For example, to date, neurobiological datasets have been acquired with uniform acquisition patterns. This means that during acquisition of neurobiological datasets, acquisition electron beams are applied with the same power and duration to all image pixels, despite the fact that useful structural information is quite heterogeneous. In other words, not all structural information is of importance, yet datasets are acquired for unimportant regions due to a lack of technology and functionality providing for efficient pixel of interest focus in electron microscopy. The same is true for electron microscopy used to analyze defects in very large-scale integration (VLSI) circuits during chip fabrication. In such analysis it is noted that there are areas of circuits that are prone to errors and others that are not, and yet typically whole images of the chips are collected at a high cost in efficiency, production, and financial investment. Therefore, there is a need in the industry to address one or more of these issues.

SUMMARY OF THE INVENTION

Embodiments of the present invention provide a system and method for learning-guided electron microscopy, which provides an optimized approach that takes into account the heterogeneity of data acquisitions by electron microscopes, spending most of the time on pixels of interest.

Briefly described, a method for rapidly collecting high quality images of a specimen through controlling a re-focusable beam of an electron microscope, is provided, where the method comprises the steps of: instructing the electron microscope to perform an initial low-resolution scan of a sample; receiving a low-resolution image of the sample as scanned image information from the electron microscope; determining regions of interest within the low-resolution image; and instructing the electron microscope to perform a high-resolution scan of the sample, only in areas of the sample corresponding to the determined regions of interest or portions of the determined regions of interest, so that other regions within the sample are not scanned at high-resolution, where the high-resolution scanning in the regions of interest is guided by a probability map using a deep neural network for segmentation.

Briefly describing architecture of the system for rapidly collecting high quality images of a specimen through controlling a re-focusable beam of an electron microscope, an intelligent acquisition system instructs the electron microscope to perform an initial low-resolution scan of a sample. A low-resolution image of the sample is received by the intelligent acquisition system as scanned image information from the electron microscope. The intelligent acquisition system then determines regions of interest within the low-resolution image and instructs the electron microscope to perform a high-resolution scan of the sample, only in areas of the sample corresponding to the determined regions of interest or portions of the determined regions of interest, so that other regions within the sample are not scanned at high-resolution, where the high-resolution scanning in the regions of interest is guided by a probability map using a deep neural network for segmentation.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

DETAILED DESCRIPTION

The present system and method optimizes data acquisition of approach that takes into account the heterogeneity of such data acquisitions, spending most of the time on pixels of interest. The present system and method uses convolutional neural nets that leverage advances in high performance computing in order to cast attention on relevant image details, while largely ignoring others. Intelligent data collection is performed by the present system and method to accelerate acquisition by orders of magnitude. The present system and method may include a scanning electron microscope or it may connect to an electron microscope. For example, the present system and method is applicable to most single beam scanning electron microscopes. Such application is at a fraction of the cost of modern multi-beam scanning microscopes currently used for such tasks. In addition, the present system and method accelerates acquisition of electron microscope images and other microscopy images, by orders of magnitude and at a very low cost, by making use of long neglected features of modern microscope functionality: the ability to guide the beam to perform targeted acquisition of varying regions at varying resolutions and intensities of the scanned image.

The present system and method provides electron microscope images and image stacks where regions of importance to a given problem domain are imaged at high resolution. Multiple embodiments may be used in accordance with the present system and method, a number of which are described herein. Regardless of the embodiment used, core functionality of the present invention is similar and is explained in detail herein.

The present system and method uniquely controls the beam of electron microscopes to collect high quality images by moving intelligently and non-uniformly over image pixels. Artifacts of interest are detected and the beam is focused only in those areas, ignoring unimportant high information-content structures, thus the terminology "moving intelligently" and non-uniformly.

In accordance with the present invention, automated, non-uniform collection may be performed multiple different ways. For example, the system and method may use a microscope's ability to rapidly collect a low-resolution image, and then use general learned knowledge to identify a region of interest from training datasets or obtained data from previous slices of the same specimen, to infer which areas are of interest. This process of inferring, as well as the use of the low-resolution image, general learned knowledge, and obtained data from previous slices of the same specimen, is described in additional detail herein.

By expanding on recent advances in fast execution for deep convolution neural networks (CNNs), the present system and method is capable of performing automated, non-uniform collection in real-time. The present system and method can provide close to terabyte/hour CNN image analysis execution rates on processors like the ones available on the electron microscopes of today. Alternatively, other generative techniques apart from CNNs may be used for performing automated, non-uniform collection in real-time, for example imaging reconstruction techniques such as image super-resolution to better guide intelligent acquisition.

As previously mentioned, the present system and method is intended to be used with an electron microscope. The following is a description of one such electron microscope, although it should be noted that the present invention is not limited to use with this specific electron microscope. Instead, the description is provided for ease of understanding.

While many types of electron microscopes may be used, for exemplary purposes only, use of an FEI scanning electron microscope (Magellan 400 L) is exemplified. This is a high-resolution device that can image at sub-nanometer resolutions even at low voltages. The microscope has high sensitivity and high contrast secondary and backscattered electron in-lens detectors. Charging of the stage allows for a range of landing energies for beam deceleration of high energy electrons assuring focus of electrons for high resolution imaging and high surface sensitivity at low kV energies. The microscope also possesses an electrostatic scan engine that not only gives very fast scanning (up to 50M pixels per second; i.e. 20 ns dwell time per pixel) but does so with minimal spatial distortion. Important to the present system and method, the electrostatic scanning can position the emitted beam at arbitrary spots on a sample without any speed slowdown. This feature is important to the present intelligent acquisition system. It is noted that the characteristics of fast scanning with minimal spatial distortion and providing electrostatic scanning that can position the emitted beam at arbitrary spots on a sample without any speed slowdown may be found in other electron microscope models, such as, but not limited to, other models manufactured by Zeiss and FEI.

The present system and method collects high resolution pixels (for example, but not limited to, 4 nm pixels) from targeted areas, while also collecting low resolution pixels. As a non-limiting example, if collection is performed at 16 nm the 16-fold worse resolution will still allow for detection of sufficient structure in the image, and will be acquired at a rate that is 16 times faster. As an example, if an image has 1k×1 k pixels to scan, then taken at 16 nm resolution at the same field of view, will only takes 1k×1 k/16 pixels, so it is 16 times faster than taking images at the original resolution (4 nm).

Figure 1:
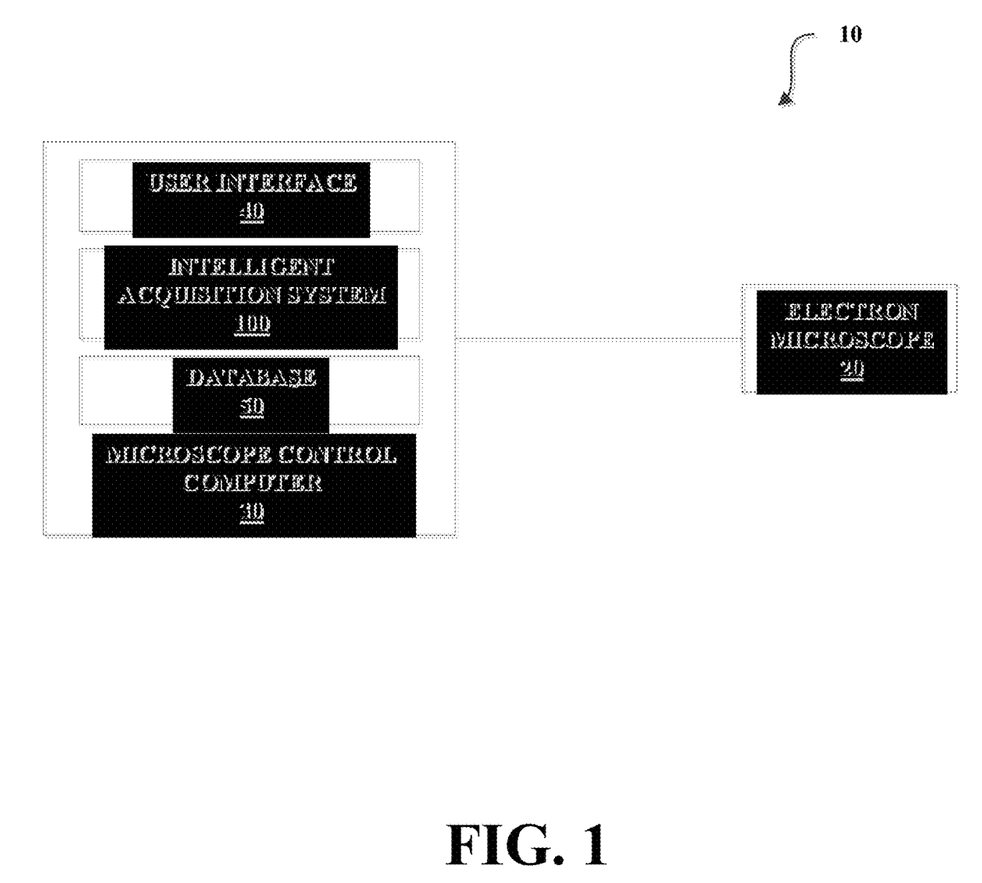
FIG. 1 is a schematic diagram illustrating a network containing the present intelligent acquisition system and an electron microscope.

FIG. 1 is a schematic diagram illustrating a network 10 containing the present intelligent acquisition system 100 and an electron microscope 20. As shown, the network contains an electron microscope 20 as previously described. The electron microscope 20 is connected to a microscope control computer 30, which controls the microscope 20 and provides user control for sophisticated beam manipulations through a user interface 40 provided by a control file, which allows scans of arbitrary user defined geometries. Of course, the microscope control computer 30 may be part of the microscope 20 itself, as opposed to a separate unit in communication with the microscope 20, as illustrated by FIG. 1.

The intelligent acquisition system 100 is located and defined within the microscope control computer 30. The system 100 manipulates the microscope 20 by writing to its control file defined within the microscope control computer 30. In addition, the intelligent acquisition system 100 receives image data back from the microscope 20 and such data is stored within a local database 50 within the microscope control computer 30, or remotely. It is noted that the intelligent acquisition system 100 may instead be provided within a graphics processing unit (GPU) or within a central processing unit (CPU) of a microscope. In addition, the intelligent acquisition system 100 may be provided within an external commodity multi-core machine that may be placed near to the microscope 20 in order to deliver computation speeds necessary.

The present system and method minimizes time taken to perform full-resolution electron microscopy (EM) imaging (scanning) of salient features within, for example, but not limited to, a stack of neural tissue samples or individual samples given additional fast low-resolution scans. For exemplary purposes of implementation, cell membranes can be used as an example of salient features, although the present system and method can be readily applied to image synapses, vesicles or other cellular bodies. Many scanning electron microscopes have a negligible cost for redirecting the beam based on their electrostatic scanning mechanism, and thus the main cost is that of applying the beam to a given area of the image.

In accordance with the present invention, such electron microscopes can have the pattern of pixels to be collected determined by a bitmap, a digital map that corresponds to the view area (beam reachable image) of the microscope, in which each pixel is either a 1 or a 0 based on whether it should be collected or not. The microscope control computer 30 can direct the beam, based on the bitmap, to collect only the pixels that have a value of 1.

Collecting a high resolution (HR) 4 nm per pixel image takes about 20 ns per pixel, and one can collect larger pixels, for example 16 nm, with the same speed. This low resolution (LR) would be 16-fold worse, but can allow detection of structural details in the image at a rate that is 16 times faster, implying that it can be performed many times at the same cost of one high resolution acquisition. This basic principle is used by the present system and method, as described hereinafter. As is known by one having ordinary skill in the art, the definition of high resolution or low resolution can be varied for different purposes and objects. There is no strict range of high resolution. For connectomics, for example, one might claim a high resolution range as 3-5 nm, while a low-resolution would be a resolution larger than this value, for example 16 nm-32 nm or so.

Figure 2:
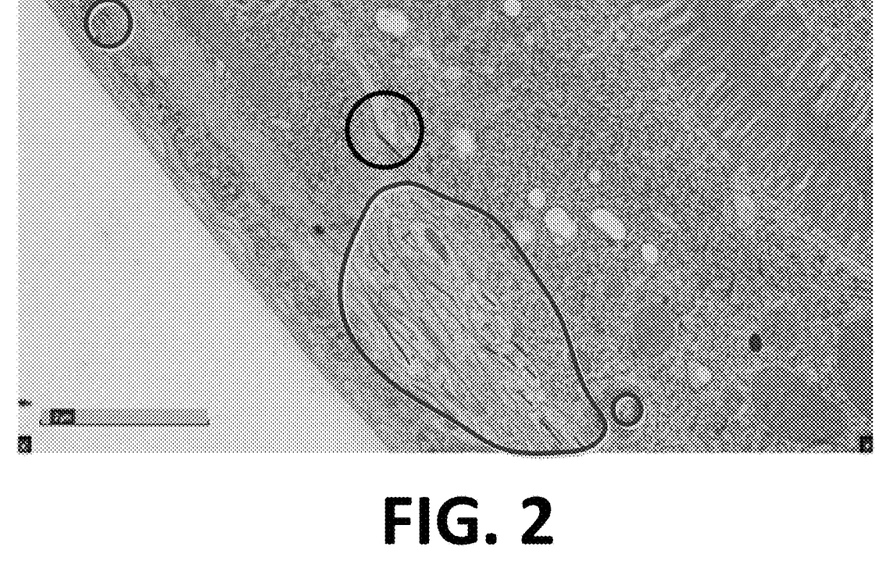
FIG. 2 illustrates a section fragment of a C. elegans worm slice that shows neurons circled within their cell boundaries.
Figure 3:
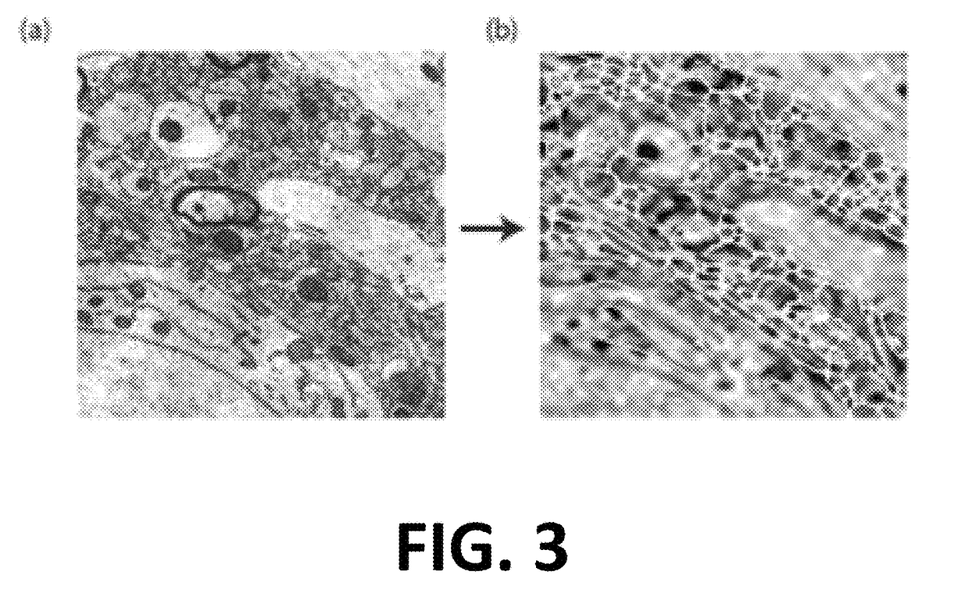
FIG. 3 is a demonstration of learning-guided active acquisition, where a) illustrates the low-resolution version is firstly collected and b) illustrates a detected region of interest (ROI) that is re-scanned with high-resolution in accordance with the present invention.

The ceiling on obtainable speed-up of intelligent acquisition is inversely proportional to the portion of the EM sample covered by the salient features. In the case of neuron membranes, for example, this is approximately 5-10% in rodent visual cortex and less than 1% in worm slices (i.e., the bitmap would have about 5-10% ones or 1% ones in the case of a worm), suggesting that an order-of-magnitude or more speed-up is highly plausible. Example EM images are shown in FIG. 2 and FIG. 3. FIG. 2 illustrates a section fragment of a *C. elegans* worm slice that shows neurons circled within their cell boundaries. Neurons account for about 5% of the image and the neuron cell boundaries for about 1% of it. If one considers a complete slice, both numbers would be reduced by another order of magnitude. FIG. 3 provides a demonstration of learning-based active acquisition, where a) illustrates the low-resolution version is firstly collected and b) illustrates a detected region of interest (ROI) that is re-scanned with high-resolution in accordance with the present invention.

For sparser features, for example, vesicles and synapses, and in other disciplines, for example, in cell cultures, there is room for even greater increase in speed.

Of importance to the present system and method is identifying the smallest workable regions of interest: the sub-areas that can be imaged at high resolution without introducing false negatives. The regions of interest are defined with training a ROI segmentation network on training datasets, or on data from previous slices of the same specimen. One having ordinary skill in the art would know that the ROI segmentation network is a software model. As explained and demonstrated herein, the final multi-resolution image is quicker to generate, and yet does not reduce the ability to segment salient features, shown in the schematic diagram of FIG. 4, which is described along with the flowchart of FIG. 5 herein.

Figure 5:
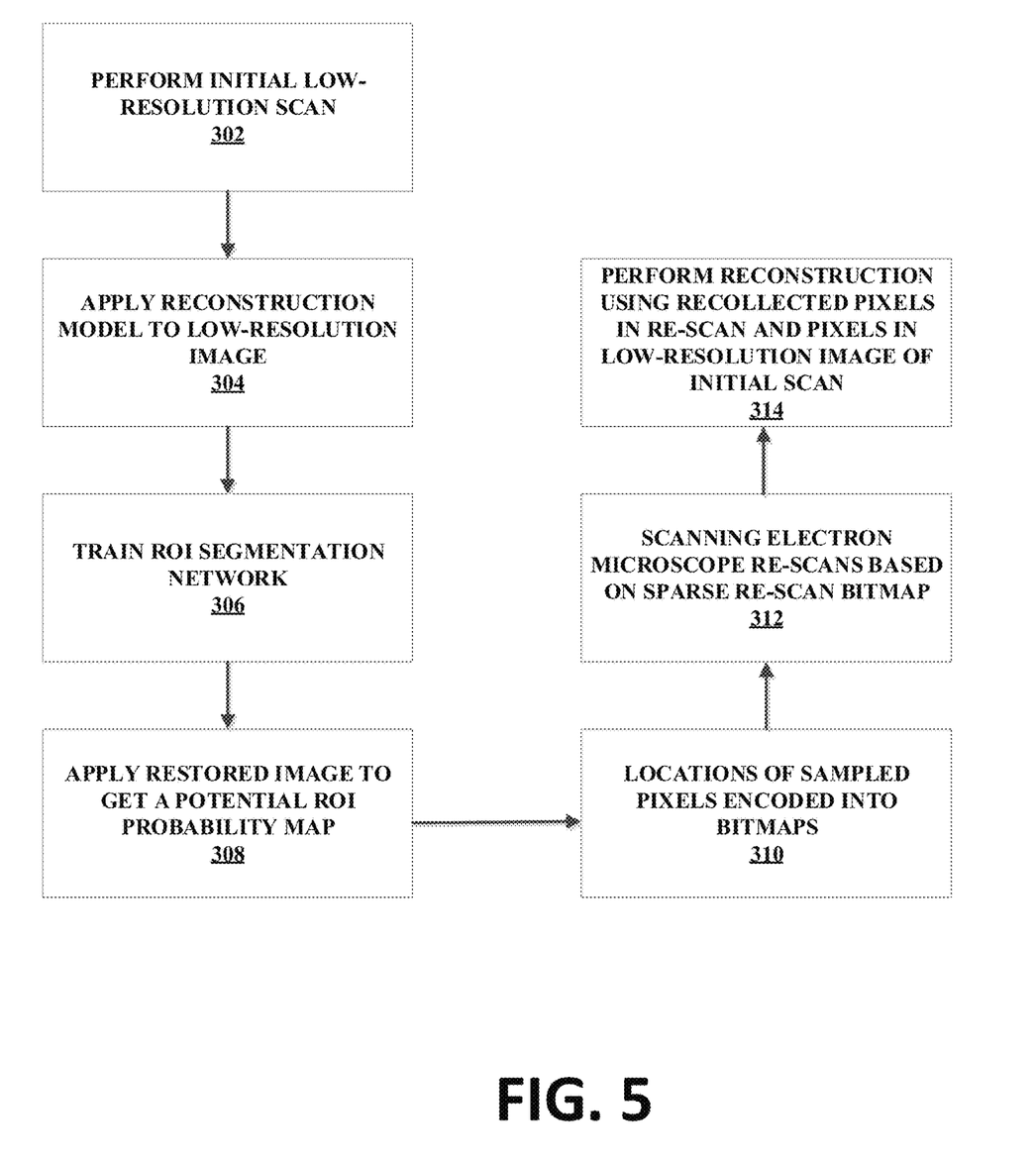
FIG. 5 is a flowchart illustrating a first exemplary method for implementing the functionality of the intelligent acquisition system of FIG. 1.

FIG. 5 is a flowchart 300 illustrating a first exemplary method for implementing the functionality of the intelligent acquisition system 100 of FIG. 1. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

As shown by block 302, the first step performed by the present method is to use the electron microscope 20 to perform an initial low-resolution scan of a sample to obtain scanned image information, resulting in a lossy image. It is noted that category of resulting image is dependent on the content of images in original resolution. For example, if the content is empty or includes a line, a low-resolution version can be used and interpolated without loss. However, for most natural images, when sufficient resolution was not applied, they will become lossy.

Instructions to perform the initial scan of information providing the lossy image are provided by the intelligent acquisition system 100. In accordance with the present invention, the initial scan phase (number 1 in FIG. 4) is to collect a low-resolution image version (labelled as LR in FIG. 4) with negligible cost, considered as the down-sampling version of a full-resolution scan. For the electron microscope 20, this process could be completed to either scan a large field of view (FoV) with the same image size or use a sparse grid bitmap to scan sampled pixels.

As shown by block 304 (as well as number 2 in FIG. 4), the next step is to apply a reconstruction model to the obtained low-resolution image based on learning based methods. The learning based reconstruction method uses a deep neural network, where input to the deep neural network is the low-resolution image, and the target is the high-resolution image. The training is performed to minimize the loss between prediction and target. The loss can use the mean square loss, or adding adversarial loss. The result of this step is illustrated as SR in FIG. 4. The reconstruction is able to improve the quality and add more details to low-resolution images.

It is then necessary to train the ROI segmentation network, as shown by block 306. The ROI segmentation network is trained on full-resolution electron microscope images. The ROI segmentation network can be trained on a training dataset provided before the learning-guided acquisition starts, after which its parameters are stored in the intelligent acquisition system 100. Corresponding ground truth for the training dataset is annotated and used to identify a pixel of interest. The ROI segmentation network is the deep neural network (model), which is defined within the intelligent acquisition system 100. The network is made of multiple artificial layers, where parameters are learned during the training. The parameters and structure of this model are stored in the intelligent acquisition system 100, and the model is available to run for the calculation during acquisition. Since one having ordinary skill in the art would know how such training of an ROI segmentation network is performed, a further description of this training is not provided herein. For exemplary purposes, the ROI may be the membrane (border) of each neuron, which are important regions for segmentation.

As shown by block 308, the intelligent acquisition system applies the restored image to obtain a potential ROI probability map. Specifically, the reconstructed image (the output of the reconstruction model) from block 304 is given to the ROI segmentation network previously described in block 306 as the input, and then a probability map of ROI is generated, as shown by FIG. 4.

Figure 4:
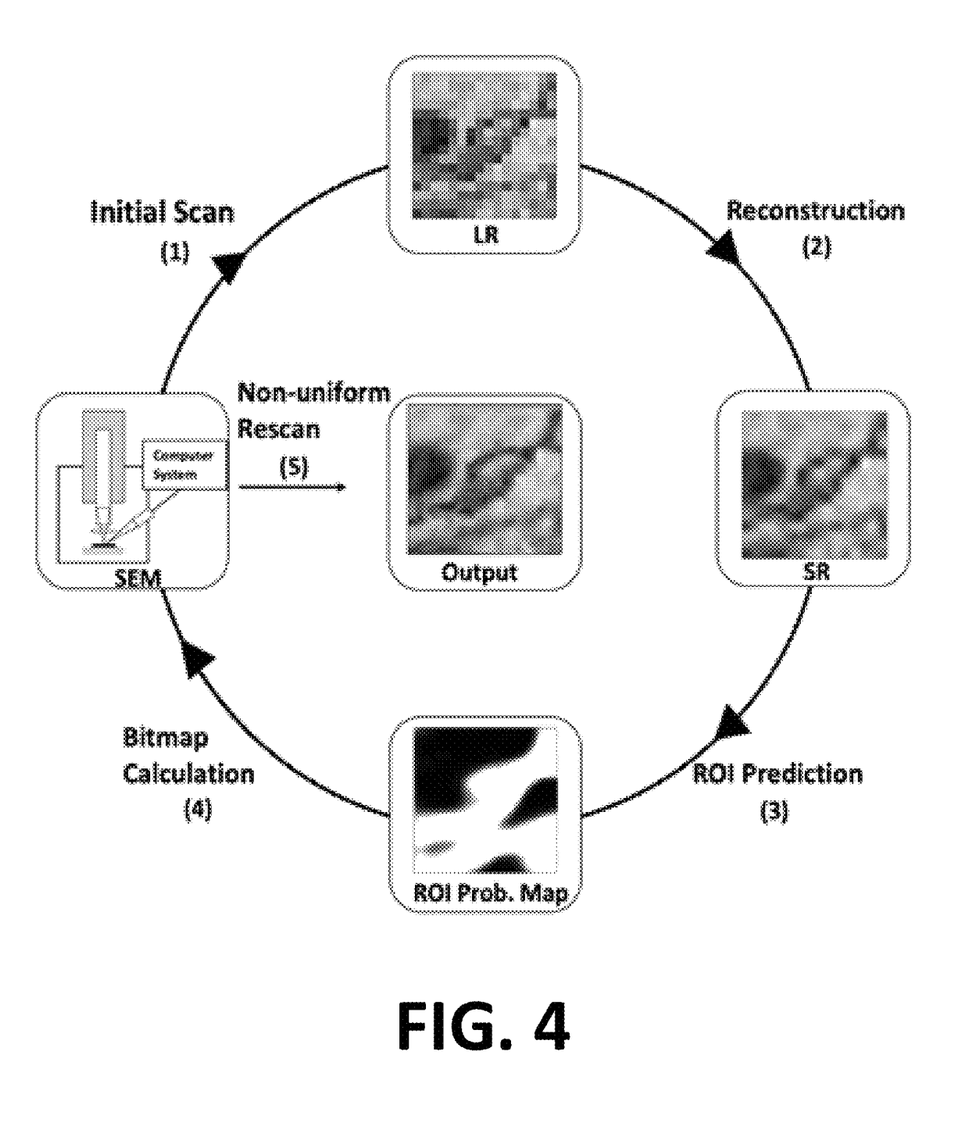
FIG. 4 is a schematic diagram graphically illustrating steps performed by the intelligent acquisition system of FIG. 1.

As shown by block 310, as well as number 4 in FIG. 4, locations of sampled pixels are encoded into bitmaps by the intelligent acquisition system 100 (FIG. 1) and loaded into the scanning electron microscope (SEM) 20 (FIG. 1) as a sparse re-scan bitmap. The bitmap also defines which regions within the recollected pixels are to be rescanned at high-resolution, and which regions within the recollected pixels are to be rescanned at low-resolution. As shown by block 312, as well as number 5 in FIG. 4, the SEM 20 (FIG. 1) then re-scans based on the sparse re-scan bitmap. It should be noted that based on the re-scan bitmap, the SEM 20 (FIG. 1) may re-scan the entire region of interest as high-resolution, re-scan the entire region of interest as low-resolution, or re-scan a portion of the entire region of interest as high-resolution and re-scan a portion of the entire region of interest as low-resolution. A reconstruction is then performed by the intelligent acquisition system 100 using the recollected pixels in the re-scan as well as the pixels in the low-resolution image collected in the initial scan (block 314).

Merely for exemplary purposes, the following is an example of pseudocode that may be used to performing for laying out the steps performed by the present intelligent acquisition system and method. The pseudocode provides a description using the acquisition of a low-resolution image and a CNN neural network, although this particular embodiment can be improved by adding other more sophisticated deep learning approaches such as reconstruction methods, and the pseudocode itself can use repeated application of the detection of regions of interest and the corresponding bit map collection. A collection pipeline based on region of interest to speed up the data acquisition process can be provided by the following pseudocode.

Collect initial LR image $I_{low}$ using a bitmap that is all 1s
   Predict region of interest in HR image $I_{high}$ based on CNN with input how and generate output that returns a probability map for each pixel in $I_{high}$
   Threshold the probability map of region of interest in $I_{high}$ to generate a sparse bitmap $B_{map}$ of $I_{high}$
   Insert the $B_{map}$ into the electron-microscope for re-collection
   Re-collect pixels in $B_{map}$ (and can also merge how) to generate new multi-resolution image $I_{new}$ The following, for exemplary purposes, provides an in-depth exemplary analysis of all components previously mentioned on representative connectomics datasets. We demonstrate their efficiency with comparison between other baselines. It is noted that this is a non-limiting example.

Figure 6:
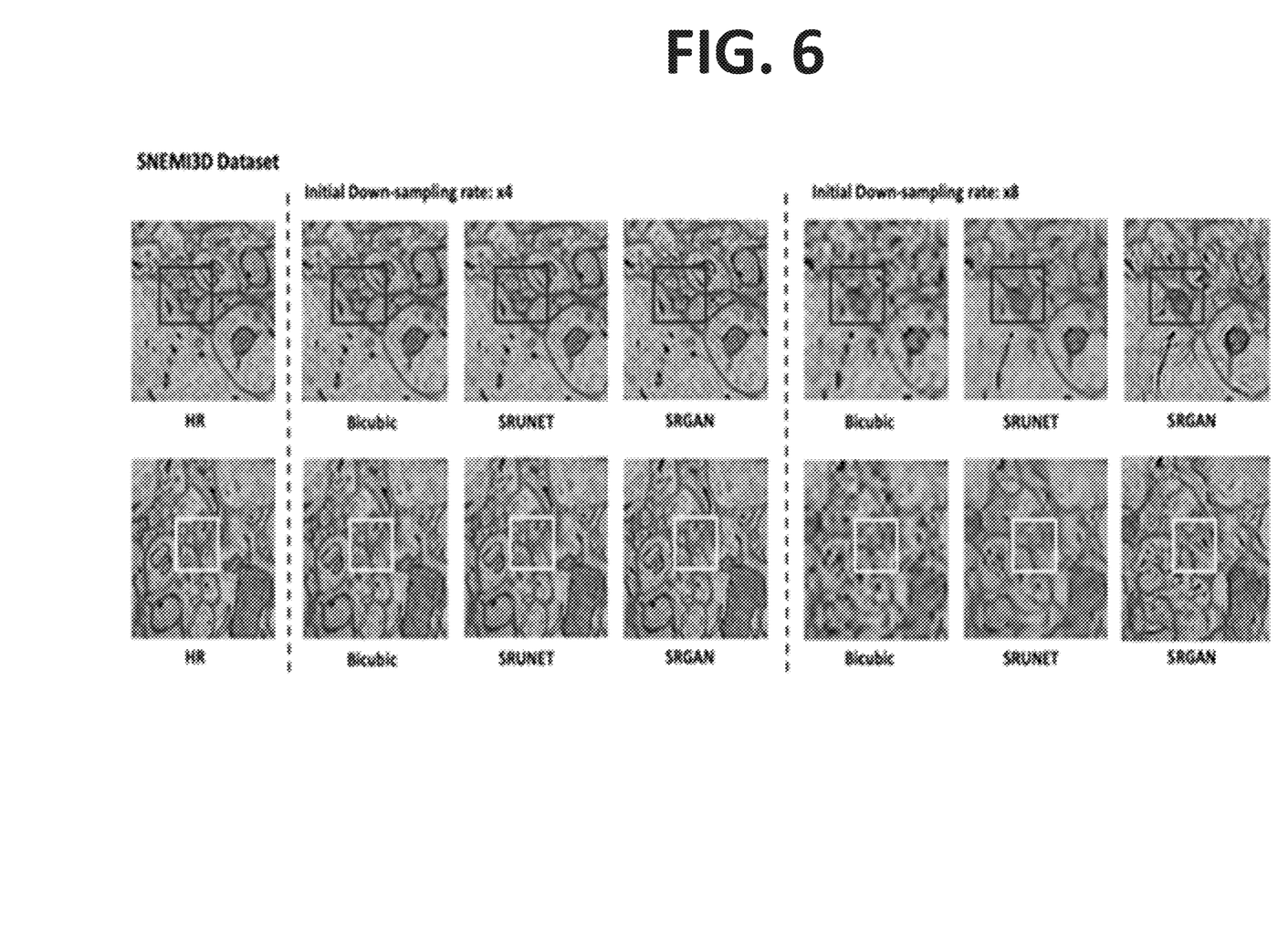
FIG. 6 is a schematic diagram providing the visualization of restored images.

To achieve the restoration of lossy images collected with low cost, we take advantage of the efficient model based on conditional generative adversarial network (GAN) to implement the image-to-image (pix2pix) translation proposed by Isola. et al. The generator in this model is a UNET structure with an additional up-sampling layer to match the size of low-resolution images to its target high-resolution images. The discriminator is a standard VGG network. We evaluate its performance with and without adversarial training. For the model SRGAN with adversarial training (using Resnet as the generator), the objective loss function for the generator is combined with L1 loss, with weight of 100, and adversarial loss from the discriminator, with a weight of 1. For model SRUNET without the adversarial training, it considers the problem as a simple regression task, the objective loss function for the generator is L1 loss. For simplicity, we use bicubic interpolation here as a baseline. We test the performance of restoration using different sampling rates of 4, 8, 16 of low-resolution images. The visualization of restored images is illustrated by FIG. 6. FIG. 6 provides visualizations of reconstruction image quality, using different reconstruction methods Bicubic, SRGAN, SRUNET evaluated on SNEMI3D dataset from ISBI2013 challenge. The boxes mark the artifacts after reconstruction.

As shown in Table 1, restoration model SRUNET is capable of achieving the best results for ROI information preservation. We demonstrate that although SRGAN is claimed to provide more photo-realistic features, border information is not well-preserved. Moreover, the error of the ROI prediction after reconstruction still remains large. This illustrates that using reconstruction techniques will not guarantee high quality images which satisfies our request.

The ROI detector is a network using UNET structure which is trained on high-resolution images and the corresponding ground truth labels of membrane annotated by human, and using binary cross-entropy as loss function. The same network is also used for ROI detection on super-resolved images and quality evaluation.

TABLE 1

| Case | DS rate | Bicubic | SRGAN | SRUNET |
|---|---|---|---|---|
| w/ ROI | ×4 | 0.089 | 0.088 | 0.074 |
|  | ×8 | 0.195 | 0.212 | 0.165 |
|  | ×16 | 0.288 | 0.344 | 0.335 |
| w/o ROI | ×4 | 0.047 | 0.058 | 0.043 |
|  | ×8 | 0.076 | 0.091 | 0.069 |
|  | ×16 | 0.103 | 0.124 | 0.092 |

Figure 7:
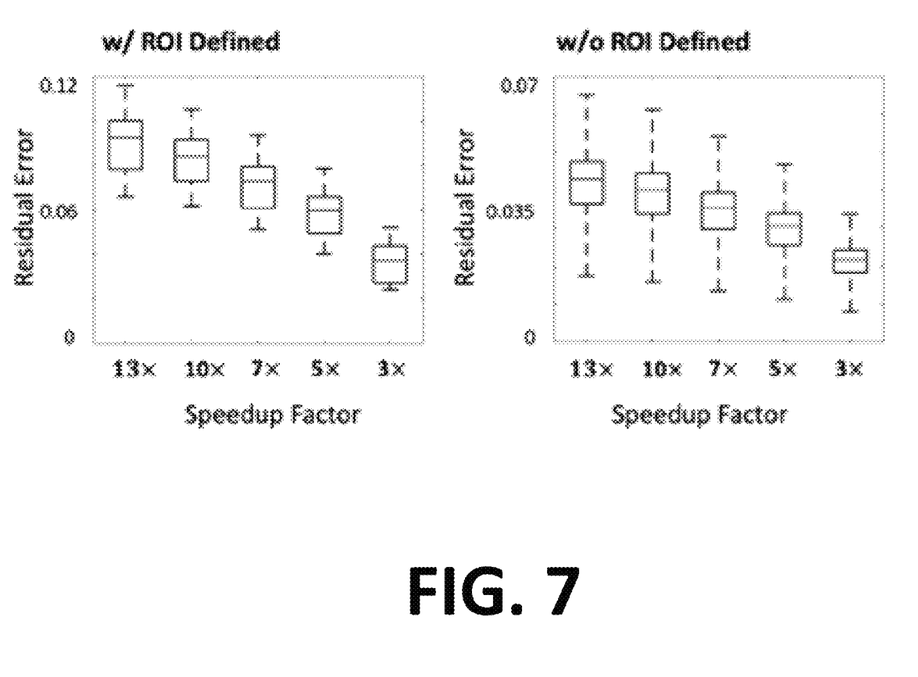
FIG. 7 is a diagram illustrating overall increase in speed using the present intelligent acquisition system.

An evaluation of the overall speedup using the present intelligent acquisition system and method was performed. The results are illustrated in FIG. 7. For exemplary purposes and demonstration, the initial scan was evaluated with down-sampling rate of ×4. For each image in the test data, we used a different total scan rate inversely proportional to the speedup factor. A study was performed of the speedup factors ranging from ×3 to ×13. Learning-guided scanning was evaluated for both cases with or without ROI defined. The results, as shown by FIG. 7, demonstrate that the present system and method can achieve a speedup factor of up to an order of magnitude with relatively small error. The box plots represent different speedup factors with residual error (L1 loss) using the present system and method.

Figure 8:
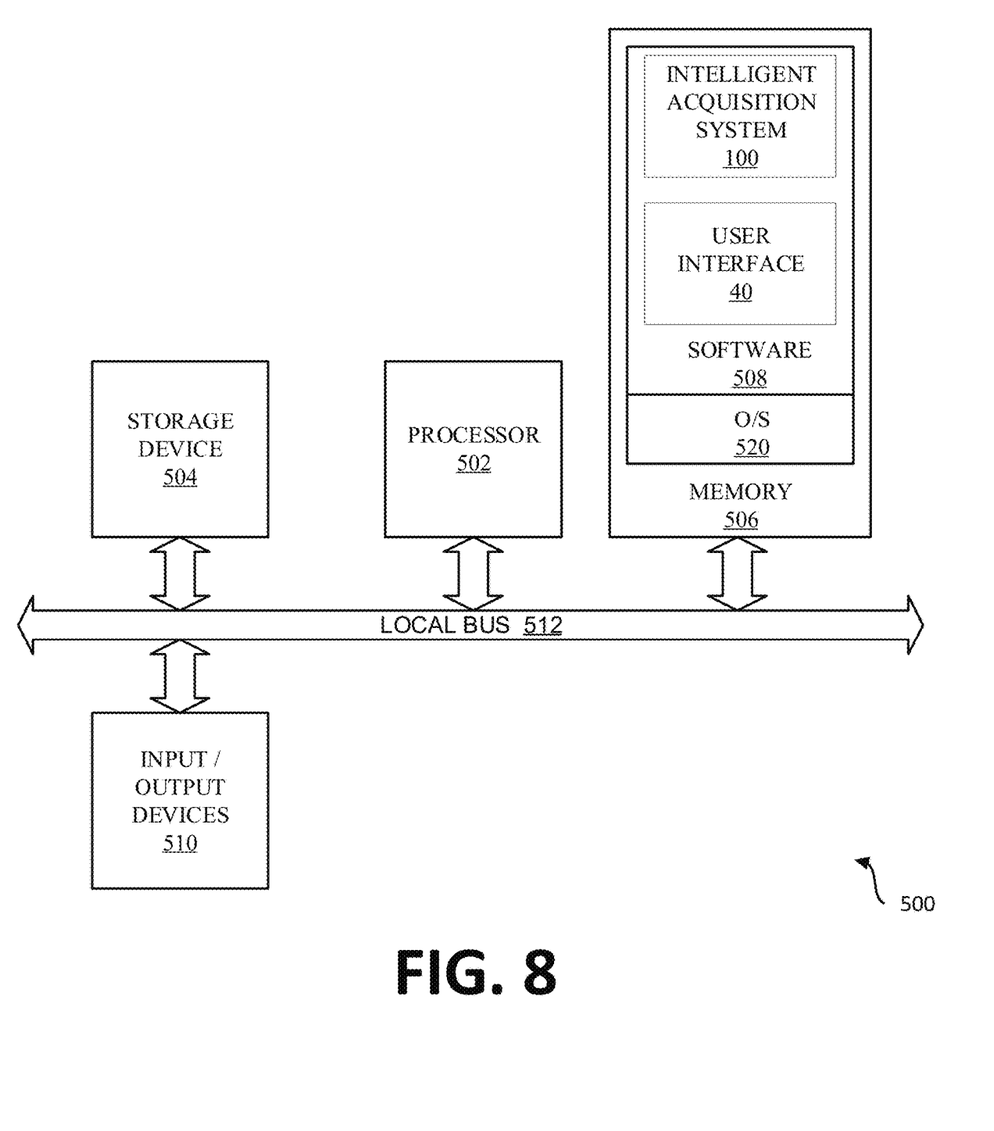
FIG. 8 is a schematic diagram illustrating the microscope control computer of FIG. 1, having the intelligent acquisition system therein.

The microscope control computer referred to within the present disclosure for executing functionality of the intelligent acquisition system 100 described in detail above may be one or more computers, an example of which is shown in the schematic diagram of FIG. 8. The microscope control computer (30 in FIG. 1, and 500 in FIG. 8) contains a processor 502, a storage device 504, a memory 506 having software 508 stored therein that defines the abovementioned functionality, input and output (I/O) devices 510 (or peripherals), and a local bus, or local interface 512 allowing for communication within the computer 500. The local interface 512 can be, for example, but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the microscope control computer 500, in accordance with the present invention. The software 508 in the memory 506 may include one or more separate programs, each of which contains an ordered listing of executable instructions for implementing logical functions of the computer 500, as previously described. The memory 506 may contain an operating system (O/S) 520. The operating system essentially controls the execution of programs within the computer 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the computer 500 is in operation, the processor 502 is configured to execute the software 508 stored within the memory 506, to communicate data to and from the memory 506, and to generally control operations of the computer 500 pursuant to the software 508, as explained above.

When the functionality of the computer 500 is in operation, the processor 502 is configured to execute the software 508 stored within the memory 506, to communicate data to and from the memory 506, and to generally control operations of the platform 500 pursuant to the software 508. The operating system 520 is read by the processor 502, perhaps buffered within the processor 502, and then executed.

When the present intelligent acquisition system is implemented in software, it should be noted that instructions for implementing the system can be stored on any computer-readable medium for use by or in connection with any computer-related device, system, or method. Such a computer-readable medium may, in some embodiments, correspond to either or both the memory 506 or the storage device 504. For purposes of illustration, FIG. 8 illustrates the intelligent acquisition system as functionality defined within the software 508 of the computer 500. In addition, the control file defining the user interface may be stored within the software 508.

In the context of this document, a computer-readable medium is an electronic, magnetic, optical, or other physical device or means that can contain or store a computer program for use by or in connection with a computer-related device, system, or method. Instructions for implementing the intelligent acquisition system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the intelligent acquisition system 100 is implemented in hardware, the system 100 can be implemented with any or a combination of the following technologies, which are each well known in the art: a discrete-logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

We claim:

1. A method for rapidly collecting high quality images of a specimen through controlling a re-focusable beam of an electron microscope, wherein the method comprises the steps of:

instructing the electron microscope to perform an initial low-resolution scan of a sample;

receiving a low-resolution image of the sample as scanned image information from the electron microscope;

determining regions of interest within the low-resolution image; and instructing the electron microscope to perform a high-resolution scan of the sample, only in areas of the sample corresponding to the determined regions of interest, so that other regions within the sample are not scanned at high-resolution, where the high-resolution scanning in the regions of interest is guided by a probability map using a deep neural network for segmentation.

2. The method of claim 1, wherein a probability value of the probability map defines which pixel of the regions of interest is to be scanned.

3. The method of claim 2, wherein probability values are used to define a pixel scanning order of the regions of interest.

4. The method of claim 3, wherein pixels of the regions of interest with a larger probability value are first scanned, followed by pixels of the regions of interest having a lower probability value.

5. The method of claim 1, further comprising the step of applying a reconstruction model to the received low resolution image, where the reconstruction model is supervised and regression-based (SRUNET).

6. The method of claim 5, where the regression-based SRUNET is derived with supervised machine learning.

7. The method of claim 1, wherein an initial scan percentage of the sample is $1/64^{th}$ of the sample.

8. The method of claim 1, wherein an initial scan percentage of the sample is $1/16^{th}$ of the sample.

9. The method of claim 1, further comprising the steps of:
applying a reconstruction model to the received low resolution image, resulting in a reconstructed image; and
comparing the reconstructed image to a target scanned high resolution image of the sample to determine a region of interest error.

10. The method of claim 1, wherein the high-resolution scanning in the regions of interest is guided by a bitmap that is generated from the probability map using a deep neural network for segmentation.

11. A method for rapidly collecting high quality images of a specimen through controlling a re-focusable beam of an electron microscope, wherein the method comprises the steps of:
instructing the electron microscope to perform an initial low-resolution scan of a sample;
receiving a low-resolution image of the sample as scanned image information from the electron microscope; and
instructing the electron microscope to perform a high-resolution scan of the sample, only in areas of the sample corresponding to regions of interest, so that other regions within the sample are not scanned at high-resolution, where the high-resolution scanning in the regions of interest is guided by a bitmap that is generated from a probability map using a deep neural network for segmentation,
wherein the regions of interest are not defined and where an estimated reconstruction error is used to guide the high-resolution scan of the sample.

12. The method of claim 11, wherein a probability value of the probability map defines which pixel of the regions of interest is to be scanned.

13. The method of claim 12, wherein probability values are used to define a pixel scanning order of the regions of interest.

14. The method of claim 11, further comprising the step of applying a reconstruction model to the received low resolution image, where the reconstruction model is supervised and regression-based (SRUNET).

15. The method of claim 14, where the regression-based SRUNET is derived with supervised machine learning.

* * * * *

UNITED STATES PATENT AND TRADEMARK OFFICE
CERTIFICATE OF CORRECTION

PATENT NO. : 11,557,459 B2
APPLICATION NO. : 17/469314
DATED : January 17, 2023
INVENTOR(S) : Nir Shavit et al.

Page 1 of 1

It is certified that error appears in the above-identified patent and that said Letters Patent is hereby corrected as shown below:

On the Title Page

Item "(72) Inventors" reads:
Nir Shavit, Cambridge, MA (US); Aravinathan Samuel, Cambridge, MA (US); Jeff Lichtman Cambridge, MA (US); Lu Mi Cambridge, MA (US)

Please amend to read:
Nir Shavit, Cambridge, MA (US);
Aravinthan Samuel, Cambridge, MA (US);
Jeff W. Lichtman Cambridge, MA (US);
Lu Mi, Cambridge, MA (US);
Yaron Meirovitch, Cambridge, MA (US)

Signed and Sealed this
Seventeenth Day of September, 2024

Katherine Kelly Vidal
*Director of the United States Patent and Trademark Office*